(12) United States Patent
Sudou

(10) Patent No.: US 7,034,581 B2
(45) Date of Patent: Apr. 25, 2006

(54) VOLTAGE DETECTING CIRCUIT

(75) Inventor: Minoru Sudou, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/712,148

(22) Filed: Nov. 13, 2003

(65) Prior Publication Data
US 2004/0113630 A1    Jun. 17, 2004

(30) Foreign Application Priority Data
Nov. 14, 2002    (JP) ............... 2002-330847

(51) Int. Cl.
*H03K 5/153*    (2006.01)

(52) U.S. Cl. ............... 327/77; 327/78; 327/85; 327/143

(58) Field of Classification Search ............... 327/72, 327/77, 78, 85, 142, 143; 320/145, 162, 320/163, 164; 324/433
See application file for complete search history.

(56) References Cited

U.S. PATENT DOCUMENTS

| 5,268,595 | A | * | 12/1993 | Ohshima | ............... 327/77 |
| 6,163,183 | A | * | 12/2000 | Azimi et al. | ............... 327/143 |
| 2002/0140402 | A1 | * | 10/2002 | Sudo | ............... 320/149 |

FOREIGN PATENT DOCUMENTS

JP    64-11413 A    *    1/1989

* cited by examiner

*Primary Examiner*—Long Nguyen
(74) *Attorney, Agent, or Firm*—Adams & Wilks

(57) ABSTRACT

A voltage detecting circuit that has a stable output even when a battery voltage is low includes first and second terminals connected across poles of a battery, a reference voltage generating circuit, and a comparator for comparing values of the reference voltage and voltage across the terminals. A first output circuit is connected between the first and second terminals to output a first output signal on the basis of the comparison result, a second output circuit outputs a second output signal that changes in value based on a voltage of the battery and on the basis of signals at the first and second terminals, and an output terminal outputs the first and second output signals.

9 Claims, 3 Drawing Sheets

DETECTED VOLTAGE

VOLTAGE DETECTING CIRCUIT

BACKGROUND OF THE INVENTION

1. Field of the Invention

The present invention relates to a circuit that detects a voltage between arbitrary terminals that operate at a low voltage.

2. Description of the Related Art

As a voltage detecting circuit, there has been known a circuit shown in a circuit block diagram of FIG. 6 (for example, refer to JP-A 1-245165, pages 1 to 3 and FIG. 2). That is, terminals 11 and 10 are connected with arbitrary terminals to be detected. In FIG. 6, a battery 1 is connected to the terminals 11 and 10 so that a voltage across the battery 1 is detected. Voltage division resistors 13 and 14 are connected between the terminals 11 and 10. An input of a comparator 16 is connected with a node of the voltage division resistors 13 and 14, and with a reference voltage 15. An output of the comparator 16 is connected with an inverter circuit 17. An output of an output circuit 20 is connected to an output terminal 12.

The output circuit 20 is structured by an inverter circuit which is made up of a p-channel MOS transistor (hereinafter referred to as "p-ch MOS Tr") 18 and an n-channel MOS transistor (hereinafter referred to as "n-ch MOS Tr") 19.

The voltage detection is conducted by comparing a voltage Va at the node of the voltage division resistors 13 and 14 with a voltage Vb of the reference voltage 15 through the comparator 16. That is, a voltage at which the comparator 16 is inverted is Va=Vb. In this example, Va changes due to the values of the voltage division resistors 13 and 14, and the voltage across the battery 1. Assuming that the resistance of the resistor 13 is R1, the resistance of the resistor 14 is R2, and the voltage across the battery 1 is V1, the detected voltage across the battery 1 is represented by the following expression (1) from Va=R2/(R1+R2)×V1=Vb.

$$\text{Detected Voltage}=(R1+R2)/R2 \times Vb \tag{1}$$

That is, when the voltage across the battery 1 is higher than the voltage obtained from the expression (1), the output of the comparator 16 becomes high level, and when the voltage across the battery 1 is lower than the voltage obtained from the expression (1), the output of the comparator 16 becomes low level. The output of the comparator 16 passes through the inverter circuit 17 and the output circuit 20 that constitutes the inverter and is then outputted to the output terminal 12. In other words, it is possible to detect whether the voltage across the battery 1 is higher or lower than the detected voltage in accordance with the output of the comparator 16 being high level or low level.

In general, as shown in FIG. 6, the output of the output circuit that constitutes the inverter becomes unstable at a voltage equal to or lower than its operation voltage. This is because both of the p-ch MOS Tr 18 and n-ch MOS Tr 19 which constitute the output circuit 20 are enhancement-type transistors, and therefore the transistors cannot be turned on unless a voltage equal to or higher than a threshold voltage of the transistors is applied between the gate and source of the transistors.

That is, because both of the p-ch MOS Tr 18 and the n-ch MOS Tr 19 are in an off-state at the voltage equal to or lower than the threshold voltage of the transistors, the voltage of the output terminal 12 becomes unstable.

FIG. 7 shows a voltage V12 of the output terminal 12 in an ordinate axis when the voltage V1 across the battery voltage 1 of the conventional voltage detecting circuit shown in FIG. 6 is changed as an abscissa axis. The voltage at the output terminal 12 is divided into the L level and the H level with the boundary of the detected voltage. In a region A of FIG. 7, the output of the output terminal 12 must be low voltage level (hereinafter referred to as "L level") because the voltage at the output terminal 12 is naturally the battery voltage lower than the detected voltage. However, because the voltage is lower than the threshold voltage, the n-ch MOS Tr 19 shown in FIG. 6 cannot turn on, and the output terminal 12 cannot output the L level.

In other words, when the voltage detecting circuit is used for a reset signal of an arbitrary system, in the case where the detected voltage is low, the system side judges that the voltage detecting circuit outputs H level in the region A of FIG. 7, with the result that there is a fear that the system malfunctions.

The conventional voltage detecting circuit suffers from such a problem that the output voltage of the voltage detecting circuit becomes inconstant at the operation voltage or lower, thereby making it impossible to provide an accurate voltage detection output.

SUMMARY OF THE INVENTION

Under the above circumstances, the present invention has been made to solve the above problems with the related art, and therefore an object of the present invention is to conduct an accurate voltage detection output even at an operation voltage of the voltage detecting circuit or lower.

In order to achieve the above object, according to the present invention, a depletion-type MOS transistor is added to an output terminal of a voltage detecting circuit so as to provide an accurate voltage detection output even if the voltage detecting circuit is at or below an operation voltage of the transistor.

A voltage detecting circuit according to the present invention includes a first terminal that is connected with a positive pole of a battery; a second terminal that is connected with a negative pole of the battery; a voltage dividing circuit that divides a voltage across the battery; a reference voltage circuit that generates a reference voltage; a comparator that outputs a signal on the basis of an output of the reference voltage circuit and an output of the voltage dividing circuit. Also, the voltage detecting circuit includes a first output circuit that is connected between the first terminal and the second terminal and outputs a signal on the basis of the output signal from the comparator; an output terminal that outputs the output signal from the first output circuit; and a second output circuit that outputs a signal to the output terminal on the basis of signals from the first terminal and the second terminal. In the voltage detecting circuit, the second output circuit changes over the output signal in accordance with a voltage value of the battery.

In the voltage detecting circuit according to the present invention, the second output circuit includes a depletion-type n-ch MOS transistor and a depletion-type p-ch MOS transistor which are connected in series between the output terminal and one of the first terminal and the second terminal. Further, in the voltage detecting circuit according to the present invention, a signal based on a voltage of the first terminal is input to a gate electrode of the depletion-type p-ch MOS transistor, and a signal based on a voltage of the second terminal is inputted to a gate electrode of the depletion-type n-ch MOS transistor.

In the voltage detecting circuit according to the present invention, the first output circuit includes an enhancement-type n-ch MOS transistor and an enhancement-type p-ch MOS transistor which are connected in series between the first terminal and the second terminal. Further, in the voltage detecting circuit according to the present invention, a signal based on the output of the comparator is inputted to gate electrodes of the enhancement-type p-ch MOS transistor and the enhancement-type n-ch MOS transistor. Still further, in the voltage detecting circuit according to the present invention, an absolute value of threshold voltages of the depletion-type n-ch MOS transistor and the depletion-type p-ch MOS transistor is larger than an absolute value of threshold voltages of the enhancement-type n-ch MOS transistor and the enhancement-type p-ch MOS transistor.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
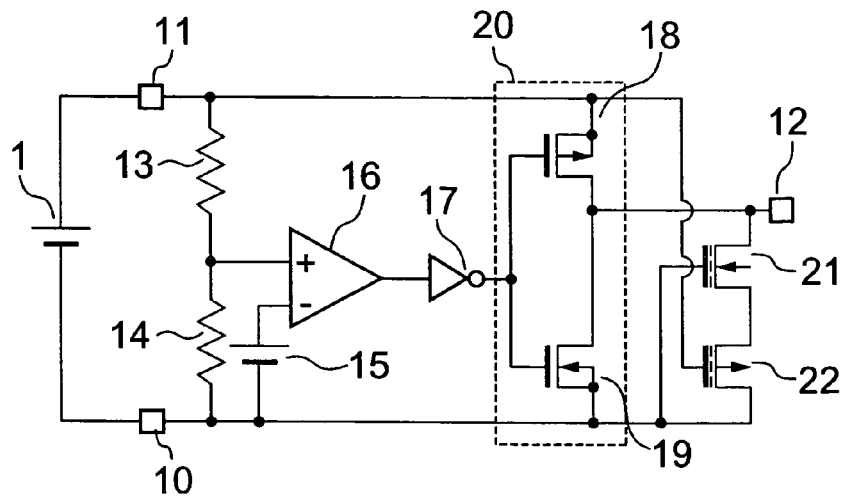
FIG. 1 is a diagram showing a voltage detecting circuit in accordance with a first embodiment of the present invention.
Figure 6:
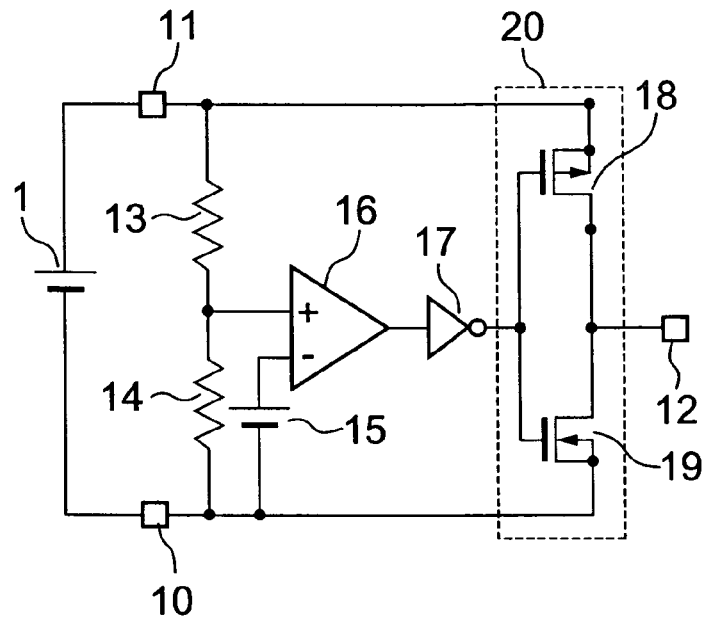
FIG. 6 is a diagram showing a conventional voltage detecting circuit.
Figure 7:
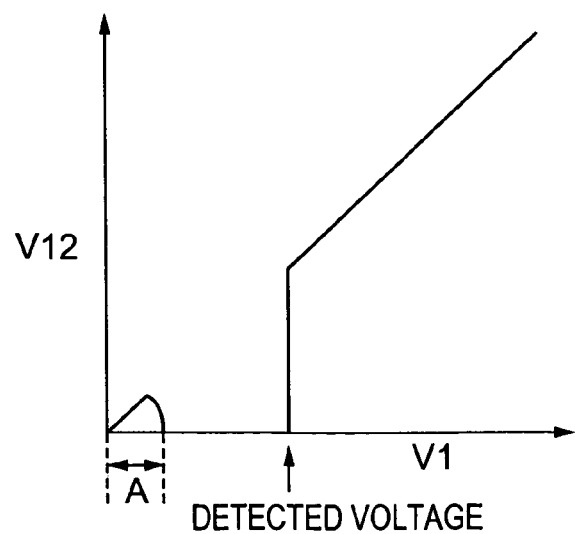
FIG. 7 is an explanatory diagram showing the operation of the conventional voltage detecting circuit.

FIG. 1 is a diagram showing a voltage detecting circuit in accordance with a first embodiment of the present invention. A difference between FIGS. 1 and 6 resides in that a depletion-type n-ch MOS Tr 21 and a depletion-type p-ch MOS Tr 22 are connected to an output terminal 12. The basic voltage detection operations are the same as those in the conventional voltage detecting circuit.

When a voltage V1 across a battery 1 is lower than threshold voltages of enhancement-type MOS Tr 18 and 19, both of the depletion-type n-ch MOS Tr 21 and the depletion-type p-ch MOS Tr 22 turn on with the result that the output of the output terminal 12 becomes L level.

In this example, when an absolute value of the threshold value of the depletion-type p-ch MOS Tr 22 is made equal to or slightly larger than an absolute value of the threshold value of the enhancement-type n-ch MOS Tr 19, the enhancement-type n-ch MOS Tr 19 can turn on before the voltage across the battery V1 at which the depletion-type p-ch MOS Tr 22 turns off is reached, whereby the voltage level of the output terminal 12 can be kept to L.

In addition, when the voltage V1 across the battery 1 is increased, the depletion-type p-ch MOS Tr 22 turns off in a short time, and a path through which the output terminal 12 is lowered to L by the depletion-type n-ch MOS Tr 21 and the depletion-type p-ch MOS Tr 22 becomes high in impedance and does not function. In this state, the voltage detecting circuit according to the present invention is equivalent to the conventional voltage detecting circuit.

When the voltage V1 of the battery 1 is further increased, the voltage V1 becomes the detected voltage of the voltage detecting circuit in a short time, and the voltage of the output terminal 12 is changed from L level to H level at that voltage.

After changing to H level, since the depletion-type n-ch MOS Tr 21 turns off, the voltage detecting circuit according to the present invention is equivalent to the conventional voltage detecting circuit.

Figure 2:
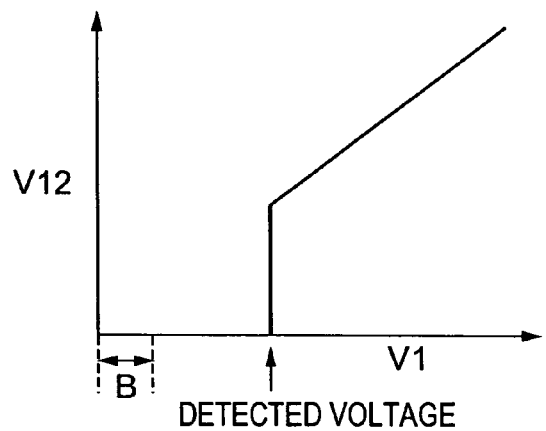
FIG. 2 is an explanatory diagram showing the operation of the voltage detecting circuit in accordance with the first embodiment of the present invention.

FIG. 2 shows a voltage V12 of the output terminal 12 in an ordinate axis when the voltage V1 across the battery 1 of the voltage detecting circuit according to the present invention is changed as an abscissa axis. In a region B of FIG. 2, since both of the depletion-type n-ch MOS Tr 21 and the depletion-type p-ch MOS Tr22 are on, the voltage at the output terminal 12 is maintained at an L level.

In other words, the voltage detecting circuit according to the present invention eliminates an unstable region (uncertain output region) of the voltage detecting circuit at the time of a low voltage without increasing a consumed current of the voltage detecting circuit, and conducts the same operation as that of the conventional voltage detecting circuit when the voltage is high.

Figure 3:
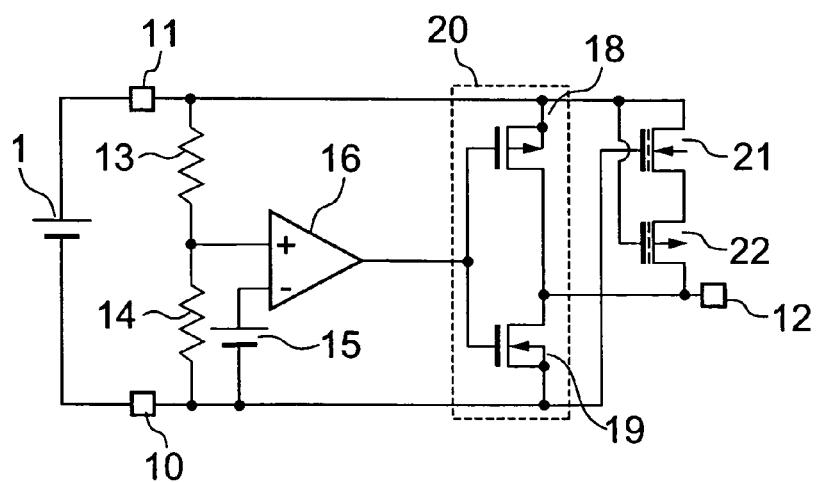
FIG. 3 is a diagram showing a voltage detecting circuit in accordance with a second embodiment of the present invention.

FIG. 3 shows a voltage detecting circuit in accordance with a second embodiment of the present invention. Differences of FIG. 3 from FIG. 1 reside in that the inverter circuit 17 is removed, the output of the comparator 16 is connected to the input of the output circuit 20, and electric elements connected in series to the depletion-type n-ch MOS Tr 21 and the depletion-type p-ch MOS Tr 22 are connected between the output terminal 12 and the terminal 11, that is, to the plus side of the battery 1.

In addition, in FIG. 3, since there is no inverter 17, the L level and H level of the output terminal 12 are inverted with respect to the voltage across the battery 1 as compared with the case of FIG. 1. That is, the output terminal 12 becomes H in level when the voltage across the battery 1 is the detected voltage or lower, whereas the output terminal 12 becomes L in level when the voltage across the battery 1 is the detected voltage or higher.

When a voltage V1 across a battery 1 is lower than threshold voltages of enhancement-type MOS Tr 18 and 19, both of the depletion-type n-ch MOS Tr 21 and the depletion-type p-ch MOS Tr 22 turn on with the result that the output of the output terminal 12 becomes H in level.

In this example, when an absolute value of the threshold value of the depletion-type n-ch MOS Tr 21 is made equal to or slightly larger than an absolute value of the threshold value of the enhancement-type p-ch MOS Tr 18, the enhancement-type p-ch MOS Tr 18 can turn on before the voltage across the battery V1 at which the depletion-type n-ch MOS Tr 21 turns off, whereby the voltage level of the output terminal 12 can be kept to H.

In addition, when the voltage V1 across the battery 1 is increased, the depletion-type n-ch MOS Tr 21 turns off in a short time, and a path through which the output terminal 12 is raised to H by the depletion-type n-ch MOS Tr 21 and the depletion-type p-ch MOS Tr 22 becomes high in impedance and does not function. In this state, the voltage detecting circuit according to the present invention is equivalent to the conventional voltage detecting circuit.

When the voltage V1 of the battery 1 is further increased, the voltage V1 becomes the detected voltage of the voltage detecting circuit in a short time, and the voltage of the output terminal 12 is changed from H level to L level at that voltage.

After changing to L level, since the depletion-type p-ch MOS Tr 22 turns off, the voltage detecting circuit according to the present invention is equivalent to the conventional voltage detecting circuit.

Figure 4:
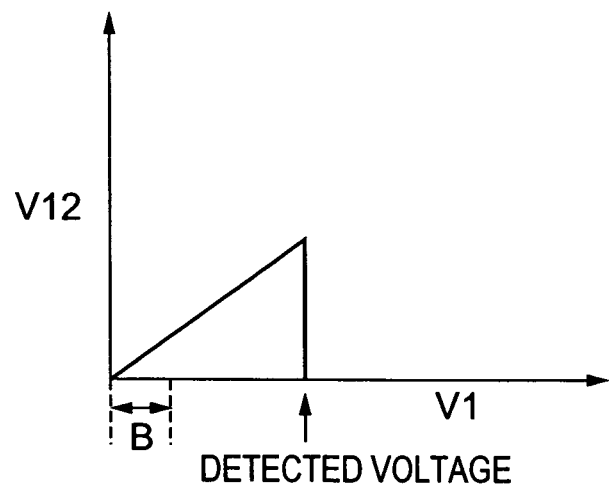
FIG. 4 is an explanatory diagram showing the operation of the voltage detecting circuit in accordance with the second embodiment of the present invention.

FIG. 4 shows a voltage V12 of the output terminal 12 in an ordinate axis when the voltage V1 across the battery 1 of the voltage detecting circuit according to the present invention is changed as an abscissa axis. In a region B of FIG. 4, since both of the depletion-type n-ch MOS Tr 21 and the depletion-type p-ch MOS Tr 22 are on, the voltage at the output terminal 12 is maintained H in level.

In other words, the voltage detecting circuit according to the present invention eliminates an inconstant region of the voltage detecting circuit at the time of a low voltage without increasing a consumed current of the voltage detecting circuit, and conducts the same operation as that of the conventional voltage detecting circuit when the voltage is high.

Figure 5:
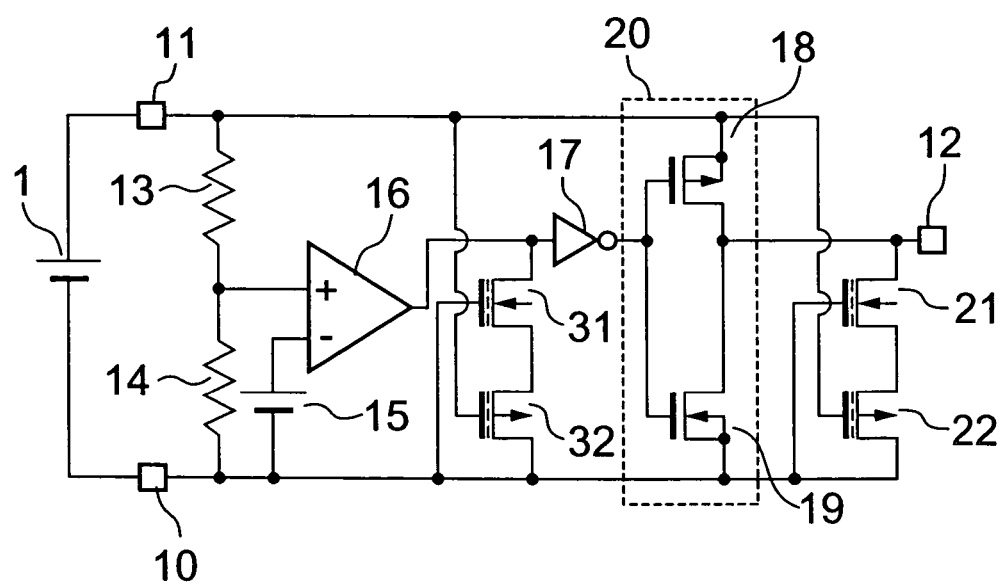
FIG. 5 is a diagram showing a voltage detecting circuit in accordance with a third embodiment of the present invention.

FIG. 5 is a diagram showing a voltage detecting circuit in accordance with a third embodiment of the present invention. A difference between FIGS. 1 and 5 resides in that a depletion-type n-ch MOS Tr 31 and a depletion-type p-ch MOS Tr 32 are connected to the output of the comparator 16.

When the voltage of the battery 1 is low and equal to or lower than the operation voltage of the comparator 16, it is not always ensured that the output of the comparator 16 becomes an accurate value. If the voltage across the battery 1 is low and the comparator 16 outputs H level when the output of the comparator 16 must be naturally L level, the inverter circuit 17 outputs L level upon receiving that output, and the output circuit 20 is going to output H level. That is, the enhancement-type p-ch MOS transistor 18 turns on.

However, because the output terminal 12 is connected with the depletion-type n-ch MOS Tr 21 and the depletion-type p-ch MOS Tr 22, the output terminal 12 is lowered to L level, and a path that is rendered conductive between the terminals 11 and 10 is generated by the enhancement-type p-ch MOS transistor 18, the depletion-type n-ch MOS Tr 21 and the depletion-type p-ch MOS Tr 22, thereby allowing an ineffective current to flow. Similarly, because the output voltage at the terminal 12 is determined in accordance with the on-resistance of the enhancement-type p-ch MOS transistor 18, the on-resistance of the depletion-type n-ch MOS Tr 21 and the on-resistance of the depletion-type p-ch MOS Tr 22, L level cannot be maintained. As its countermeasure, the depletion-type n-ch MOS Tr 31 and the depletion-type p-ch MOS Tr 32 are added to the output of the comparator 16, and the output of the comparator 16 is determined to be L in level at the time of the operation voltage of the comparator 16 or lower, thereby being capable of surely bringing the output terminal 12 into L level when the voltage of the battery 1 is low.

As described above, according to the present invention, the unstable region when the voltage detecting circuit operates at a low voltage can be eliminated.

As was described above, according to the present invention, there is an effect in that since the unstable region at the time of the low voltage is eliminated without increasing the consumed current, malfunction due to an error voltage detection signal (for example, a reset signal to the system) can be prevented.

What is claimed is:

1. A voltage detecting circuit, comprising:
   a first terminal connected to a positive pole of a battery;
   a second terminal connected to a negative pole of the battery;
   a voltage dividing circuit that divides a voltage across the battery;
   a reference voltage circuit that generates a reference voltage;
   a comparator that compares outputs of the reference voltage circuit and the voltage dividing circuit and outputs a comparison signal;
   a first output circuit connected between the first terminal and the second terminal for outputting a first output signal on the basis of the comparison signal output by the comparator;
   an output terminal for outputting the first output signal; and
   a second output circuit connected between the output terminal and one of the first and second terminals for outputting a second output signal that changes in value on the basis of a first signal and a second signal at the first terminal and the second terminal, respectively, the second output circuit comprising a depletion-type n-channel MOS transistor and a depletion-type p-channel MOS transistor connected in series between the output terminal and one of the first terminal and the second terminal; wherein the first signal at the first terminal is input to a gate electrode of the depletion-type p-channel MOS transistor, and the second signal at the second terminal is input to a gate electrode of the depletion-type n-channel MOS transistor.

2. A voltage detecting circuit according to claim 1; wherein the first output circuit comprises an enhancement-type n-channel MOS transistor and an enhancement-type p-channel MOS transistor connected in series between the first terminal and the second terminal; and wherein a signal based on the comparison signal output by the comparator is input to gate electrodes of the enhancement-type p-channel MOS transistor and the enhancement-type n-channel MOS transistor, and absolute values of threshold voltages of the depletion-type n-channel MOS transistor and the depletion-type p-channel MOS transistor are larger than absolute values of threshold voltages of the enhancement-type n-channel MOS transistor and the enhancement-type p-channel MOS transistor.

3. A voltage detecting circuit according to claim 1; wherein the first terminal is connected to the gate electrode of the depletion-type p-channel MOS transistor and the second terminal is connected to the gate electrode of the depletion-type n-channel MOS transistor.

4. A voltage detecting circuit according to claim 2; wherein the comparison signal is input to gate electrodes of the enhancement-type p-channel MOS transistor and the enhancement-type n-channel MOS transistor.

5. A voltage detecting circuit according to claim 1; wherein the first output circuit comprises two enhancement mode MOS transistors connected in series between the first and second terminals.

6. A voltage detecting circuit, comprising: input terminals; an output terminal; a reference voltage generator for generating a reference voltage; a comparator for comparing a voltage across the input terminals with the reference voltage and outputting a comparison signal; a first output circuit connected between the input terminals for outputting a first signal to the output terminal on the basis of the comparison signal; and a second output circuit connected between the output terminal and one of the input terminals for varying a resistance value between the output terminal and the one of the input terminals based on the voltage across the input terminals; wherein the first output circuit comprises two enhancement mode MOS transistors connected in series between the input terminals, the two enhancement mode MOS transistors have opposite polarities, an output of the comparator is connected to gate electrodes of the two enhancement mode MOS transistors, and the second output circuit comprises two depletion mode MOS transistors connected in series between the output terminal and one of the input terminals.

7. A voltage detecting circuit according to claim 6; wherein the two depletion mode MOS transistors have opposite polarities.

8. A voltage detecting circuit according to claim 7; wherein a gate electrode of one of the depletion mode MOS transistors is connected to one of the input terminals, and a gate electrode of the other depletion mode MOS transistor is connected to another one of the input terminals.

9. A voltage detecting circuit according to claim 8; wherein absolute values of threshold voltages of the depletion mode MOS transistors are larger than absolute values of threshold voltages of the enhancement mode MOS transistors.

* * * * *